United States Patent
Kamal et al.

(10) Patent No.: US 9,825,614 B2
(45) Date of Patent: Nov. 21, 2017

(54) ELIMINATION METHOD FOR COMMON SUB-EXPRESSION

(71) Applicant: SAMSUNG DISPLAY CO., LTD., Yongin-si, Gyeonggi-do (KR)

(72) Inventors: Hassan Kamal, Suwon-si (KR); Hee Chul Hwang, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 152 days.

(21) Appl. No.: 14/839,623

(22) Filed: Aug. 28, 2015

(65) Prior Publication Data

US 2016/0142042 A1 May 19, 2016

(30) Foreign Application Priority Data

Nov. 13, 2014 (KR) .......................... 10-2014-0158329

(51) Int. Cl.
*G06F 7/48* (2006.01)
*H03H 17/02* (2006.01)
*H03H 17/06* (2006.01)

(52) U.S. Cl.
CPC .... *H03H 17/0248* (2013.01); *H03H 17/0227* (2013.01); *H03H 17/06* (2013.01)

(58) Field of Classification Search
None
See application file for complete search history.

(56) References Cited

U.S. PATENT DOCUMENTS 7,895,420 B2* 2/2011 Fallah ..................... G06F 17/12
708/402
2007/0078816 A1* 4/2007 Stern ................. G06F 17/30961
207/0083581 A1* 4/2007 Kim .................... H03H 17/0225
708/300
2007/0180010 A1* 8/2007 Fallah ..................... G06F 17/10
708/400

FOREIGN PATENT DOCUMENTS

| KR | 10-0422443 B1 | 3/2004 |
| KR | 10-0422449 B1 | 3/2004 |
| KR | 10-2009-0103144 A | 10/2009 |

OTHER PUBLICATIONS

"A Greedy Common Subexpression Elimination Algorithm for Implementing FIR Filters;" pp. 3451-3454 2007 IEEE.*

(Continued)

*Primary Examiner* — Michael D Yaary
(74) *Attorney, Agent, or Firm* — Lewis Roca Rothgerber Christie LLP

(57) ABSTRACT

A common sub-expression elimination method for simplifying hardware logic of a hardware filter circuit by eliminating a common sub-expression included in a plurality of sub-expressions is provided. Each of the sub-expressions includes a corresponding two or more of inputs constituting a plurality of coefficients used by the hardware filter circuit. The method is implemented on a computing device and includes: identifying for each coefficient of the plurality of coefficients, a combination of the inputs constituting the coefficient; counting occurrences of the sub-expressions in each of the coefficients; identifying one or more of the sub-expressions having a maximum one of the counts and including the corresponding two or more of the inputs; selecting one of the one or more of the sub-expressions as the common sub-expression; eliminating the common sub-expression; and repeating these steps to eliminate more of the sub-expressions common to multiple ones of the coefficients.

17 Claims, 9 Drawing Sheets

(56) References Cited

OTHER PUBLICATIONS

Mehendale, M., et al., *Synthesis of Multiplier-less FIR Filters with Minimum Number of Additions,* Proc. IEEE/ACM Int. Conf. Computer-Aided Design, 1995, pp. 668-671.

Hartley, R.I., *Subexpression Sharing in Filters Using Canonic Signed Digit Multipliers,* IEEE Transactions on Circuits and Systems-II: Analog and Digital Signal Processing, vol. 43, No. 10, Oct. 1996, pp. 677-688.

Choo, H., et al., *Complexity Reduction of Digital Filters Using Shift Inclusive Differential Coefficients,* IEEE Transactions on Signal Processing, vol. 52, No. 6, Jun. 2004, pp. 1760-1772.

Xu, F., et al., *Contention Resolution Algorithm for Common Subexpression Elimination in Digital Filter Design,* IEEE Transactions on Circuits and Systems-II: Express Briefs, vol. 52, No. 10, Oct. 2005, pp. 695-700.

Vinod, A.P., et al., *On the Implementation of Efficient Channel Filters for Wideband Receivers by Optimizing Common Subexpression Elimination Methods,* IEEE Transactions on Computer-Aided Design of Integrated Circuits and Systems, vol. 24, No. 2, Feb. 2005, pp. 295-304.

Vinod, A.P., et al., *An improved common subexpression elimination method for reducing logic operators in FIR filter implementations without increasing logic depth,* Integration, the VLSI Journal, vol. 43, (2010), pp. 124-135.

Lee, "Study on Performance Improvement of Digital Filter Using MDR of Binary Number and Common Subexpression Elimination", Journal of the Korea Academia-Industrial Cooperation Society, 2009, pp. 3087-3093, vol. 10, No. 11.

\* cited by examiner

FIG. 2

| | |
|---|---|
| a0 = -0.00933078669575 | a13 = -0.00933078669575 |
| a1 = 0.03135623682714 | a14 = 0.03135623682714 |
| a2 = -0.00948598843682 | a15 = -0.00948598843682 |
| a3 = -0.04680063247432 | a16 = -0.04680063247432 |
| a4 = -0.00271831937636 | a17 = -0.00271831937636 |
| a5 = 0.12420551537587 | a18 = 0.12420551537587 |
| a6 = 0.22024453765020 | a19 = 0.22024453765020 |
| a7 = 0.07628237421426 | a20 = 0.07628237421426 |
| a8 = 0.01374432164657 | a21 = 0.01374432164657 |
| a9 = -0.03358586396879 | a22 = -0.03358586396879 |
| a10 = -0.03819695824263 | a23 = -0.03819695824263 |
| a11 = 0.05563093697248 | a24 = 0.05563093697248 |
| a12 = 0.18473033065671 | a25 = 0.18473033065671 |

FIG. 3

$$A(i,j) = \begin{bmatrix} 0 & 0 & 0 & 0 & 0 & 0 & 0 & 0 \\ 0 & 1 & 0 & 0 & 0 & 1 & 1 & 0 \\ 0 & 0 & 0 & 0 & 0 & 0 & 0 & 0 \\ 0 & 0 & 0 & 0 & 0 & 1 & 1 & 0 \\ 0 & 0 & 0 & 0 & 0 & 0 & 0 & 1 \\ 0 & 0 & 1 & 0 & 0 & 0 & 1 & 0 \\ 0 & 0 & 1 & 0 & 0 & 1 & 1 & 1 \\ 0 & 0 & 1 & 0 & 0 & 1 & 1 & 1 \\ 0 & 0 & 0 & 0 & 0 & 0 & 0 & 0 \\ 0 & 0 & 1 & 1 & 1 & 0 & 0 & 0 \\ 0 & 0 & 1 & 1 & 1 & 1 & 1 & 1 \\ 0 & 0 & 1 & 1 & 1 & 1 & 0 & 1 \\ 0 & 0 & 1 & 0 & 0 & 0 & 0 & 1 \\ 0 & 0 & 0 & 0 & 0 & 0 & 0 & 1 \\ 0 & 0 & 0 & 0 & 0 & 1 & 1 & 0 \\ 0 & 0 & 1 & 0 & 0 & 0 & 0 & 0 \\ 0 & 0 & 0 & 0 & 0 & 1 & 1 & 0 \\ 0 & 0 & 0 & 0 & 0 & 0 & 0 & 1 \\ 0 & 0 & 1 & 0 & 0 & 0 & 1 & 0 \\ 0 & 0 & 1 & 0 & 1 & 1 & 1 & 1 \\ 0 & 0 & 1 & 0 & 0 & 1 & 1 & 0 \\ 0 & 0 & 0 & 0 & 0 & 0 & 1 & 0 \\ 0 & 0 & 1 & 1 & 0 & 0 & 0 & 0 \\ 0 & 1 & 1 & 1 & 0 & 1 & 1 & 1 \\ 1 & 0 & 1 & 1 & 0 & 1 & 0 & 1 \\ 1 & 1 & 1 & 0 & 0 & 0 & 0 & 1 \end{bmatrix} \begin{matrix} A0 \\ A1 \\ A2 \\ A3 \\ A4 \\ A5 \\ A6 \\ A7 \\ A8 \\ A9 \\ A10 \\ A11 \\ A12 \\ A13 \\ A14 \\ A15 \\ A16 \\ A17 \\ A18 \\ A19 \\ A20 \\ A21 \\ A22 \\ A23 \\ A24 \\ A25 \end{matrix}$$

Input(bit): 8 7 6 5 4 3 2 1    Output

FIG. 4

$$B(i,j) = \begin{array}{c} \text{Input(bit)} \\ \phantom{B(i,j)=} \\ 1 \\ 2 \\ 3 \\ 4 \\ 5 \\ 6 \\ 7 \\ 8 \end{array} \begin{array}{cccccccc} 1 & 2 & 3 & 4 & 5 & 6 & 7 & 8 \\ \end{array} \left[ \begin{array}{cccccccc} 0 & 5 & 7 & 3 & 4 & 9 & 2 & 2 \\ 5 & 0 & 10 & 2 & 2 & 8 & 2 & 0 \\ 7 & 10 & 0 & 3 & 4 & 8 & 2 & 1 \\ 3 & 2 & 3 & 0 & 3 & 4 & 0 & 0 \\ 4 & 2 & 4 & 3 & 0 & 6 & 1 & 1 \\ 9 & 8 & 8 & 4 & 6 & 0 & 2 & 2 \\ 2 & 2 & 2 & 0 & 1 & 2 & 0 & 1 \\ 2 & 0 & 1 & 0 & 1 & 2 & 1 & 0 \end{array} \right]$$

FIG. 5

$$B(i,j)= \begin{array}{c} \text{Input(bit)} \\ \\ 1 \\ 2 \\ 3 \\ 4 \\ 5 \\ 6 \\ 7 \\ 8 \end{array} \begin{array}{cccccccc} 1 & 2 & 3 & 4 & 5 & 6 & 7 & 8 \\ \left[\begin{array}{cccccccc} 0 & 6 & 8 & 10 & 4 & 10 & 4 & 4 \\ 6 & 0 & 10 & 8 & 2 & 8 & 4 & 0 \\ 8 & 10 & 0 & 10 & 4 & 8 & 4 & 2 \\ 10 & 8 & 10 & 0 & 6 & 8 & 4 & 2 \\ 4 & 2 & 4 & 6 & 0 & 6 & 2 & 2 \\ 10 & 8 & 8 & 8 & 6 & 0 & 4 & 4 \\ 4 & 4 & 4 & 4 & 2 & 4 & 0 & 2 \\ 4 & 0 & 2 & 2 & 2 & 4 & 2 & 0 \end{array}\right] \end{array}$$

FIG. 6

$$A'(i,j) = \begin{bmatrix} 0 & 0 & 0 & 0 & 0 & 0 & 0 & 0 \\ 0 & 1 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 1 \\ 0 & 0 & 1 & 0 & 0 & 0 & 1 & 0 \\ 0 & 0 & 1 & 0 & 0 & 0 & 0 & 1 \\ 0 & 0 & 1 & 0 & 0 & 0 & 0 & 1 \\ 0 & 0 & 0 & 0 & 0 & 0 & 0 & 0 \\ 0 & 0 & 1 & 1 & 1 & 0 & 0 & 0 \\ 0 & 0 & 1 & 1 & 1 & 0 & 0 & 1 \\ 0 & 0 & 1 & 1 & 1 & 1 & 0 & 1 \\ 0 & 0 & 1 & 0 & 0 & 0 & 0 & 1 \\ 0 & 0 & 0 & 0 & 0 & 0 & 0 & 1 \\ 0 & 0 & 0 & 0 & 0 & 0 & 0 & 0 \\ 0 & 0 & 1 & 0 & 0 & 0 & 0 & 0 \\ 0 & 0 & 0 & 0 & 0 & 0 & 0 & 0 \\ 0 & 0 & 0 & 0 & 0 & 0 & 0 & 1 \\ 0 & 0 & 1 & 0 & 0 & 0 & 1 & 0 \\ 0 & 0 & 1 & 0 & 1 & 0 & 0 & 1 \\ 0 & 0 & 1 & 0 & 0 & 0 & 0 & 0 \\ 0 & 0 & 0 & 0 & 0 & 0 & 1 & 0 \\ 0 & 0 & 1 & 1 & 0 & 0 & 0 & 0 \\ 0 & 1 & 1 & 1 & 0 & 0 & 0 & 1 \\ 1 & 0 & 1 & 1 & 0 & 1 & 0 & 1 \\ 1 & 1 & 1 & 0 & 0 & 0 & 0 & 1 \end{bmatrix}$$

Input(bit): 8 7 6 5 4 3 2 1

Output: A0, A1, A2, A3, A4, A5, A6, A7, A8, A9, A10, A11, A12, A13, A14, A15, A16, A17, A18, A19, A20, A21, A22, A23, A24, A25

FIG. 7

$$A''(i,j) = \begin{bmatrix} 0 & 0 & 0 & 0 & 0 & 0 & 0 & 0 & 0 \\ 1 & 0 & 1 & 0 & 0 & 0 & 0 & 0 & 0 \\ 0 & 0 & 0 & 0 & 0 & 0 & 0 & 0 & 0 \\ 1 & 0 & 0 & 0 & 0 & 0 & 0 & 0 & 0 \\ 0 & 0 & 0 & 0 & 0 & 0 & 0 & 0 & 1 \\ 0 & 0 & 0 & 1 & 0 & 0 & 0 & 1 & 0 \\ 1 & 0 & 0 & 1 & 0 & 0 & 0 & 0 & 1 \\ 1 & 0 & 0 & 1 & 0 & 0 & 0 & 0 & 1 \\ 0 & 0 & 0 & 0 & 0 & 0 & 0 & 0 & 0 \\ 0 & 0 & 0 & 1 & 1 & 1 & 0 & 0 & 0 \\ 1 & 0 & 0 & 1 & 1 & 1 & 0 & 0 & 1 \\ 0 & 0 & 0 & 1 & 1 & 1 & 1 & 0 & 1 \\ 0 & 0 & 0 & 1 & 0 & 0 & 0 & 0 & 1 \\ 0 & 0 & 0 & 0 & 0 & 0 & 0 & 0 & 1 \\ 1 & 0 & 0 & 0 & 0 & 0 & 0 & 0 & 0 \\ 0 & 0 & 0 & 1 & 0 & 0 & 0 & 0 & 0 \\ 1 & 0 & 0 & 0 & 0 & 0 & 0 & 0 & 0 \\ 0 & 0 & 0 & 0 & 0 & 0 & 0 & 0 & 1 \\ 0 & 0 & 0 & 1 & 0 & 0 & 0 & 1 & 0 \\ 1 & 0 & 0 & 1 & 0 & 1 & 0 & 0 & 1 \\ 1 & 0 & 0 & 1 & 0 & 0 & 0 & 0 & 0 \\ 0 & 0 & 0 & 0 & 0 & 0 & 0 & 1 & 0 \\ 0 & 0 & 0 & 1 & 1 & 0 & 0 & 0 & 0 \\ 1 & 0 & 1 & 1 & 1 & 0 & 0 & 0 & 1 \\ 0 & 1 & 0 & 1 & 1 & 0 & 1 & 0 & 1 \\ 0 & 1 & 1 & 1 & 0 & 0 & 0 & 0 & 1 \end{bmatrix}$$

Input(bit): 9 8 7 6 5 4 3 2 1

Output: A0, A1, A2, A3, A4, A5, A6, A7, A8, A9, A10, A11, A12, A13, A14, A15, A16, A17, A18, A19, A20, A21, A22, A23, A24, A25

FIG. 8

$$B'(i,j) = \begin{bmatrix} 0 & 0 & 2 & 3 & 4 & 9 & 2 & 2 & 5 \\ 0 & 0 & 0 & 0 & 0 & 2 & 0 & 0 & 0 \\ 2 & 0 & 0 & 1 & 2 & 2 & 0 & 1 & 0 \\ 3 & 0 & 1 & 0 & 3 & 4 & 0 & 0 & 2 \\ 4 & 0 & 2 & 3 & 0 & 6 & 1 & 1 & 2 \\ 9 & 2 & 2 & 4 & 6 & 0 & 2 & 2 & 6 \\ 2 & 0 & 0 & 0 & 1 & 2 & 0 & 1 & 2 \\ 2 & 0 & 1 & 0 & 1 & 2 & 1 & 0 & 0 \\ 5 & 0 & 0 & 2 & 2 & 6 & 2 & 0 & 0 \end{bmatrix}$$

ELIMINATION METHOD FOR COMMON SUB-EXPRESSION

CROSS-REFERENCE TO RELATED APPLICATION

This application claims priority to and the benefit of Korean Patent Application No. 10-2014-0158329, filed in the Korean Intellectual Property Office on Nov. 13, 2014, the entire content of which is incorporated herein by reference.

BACKGROUND (a) Field

Aspects of embodiments of the present invention relate to an elimination method for common sub-expression.

(b) Description of the Related Art

In many situations, high-speed finite impulse response (FIR) filters need to be operated with low power using CMOS technology in mobile communication terminals. Regarding such filters, studies on implementations of filter coefficients represented as canonical signed digit (CSD) numbers in which the number of 1's and −1's is less than the number of 1's in the two's complement representation has been actively undertaken.

Structures in which multiplication is processed using only adders, subtractors, shifters, and delay elements in high-speed/low power filters are desired. Such structures may benefit from CSD-type coefficients, which have fewer non-zero digits than comparable two's complement coefficients.

For an N-bit number, the two's complement may be represented as $$\sum_{i=0}^{N-1} a_i 2^i,$$

where $a_{N-1}=0$ or $-1$ and $a_i=0$ or 1 for $i<N-1$. The CSD representation is similar, only each $a_i=1$, 0, or $-1$, with no two consecutive $a_i$ taking on nonzero values. Binary numbers in two's complement may be represented in CSD by repeatedly replacing strings of consecutive nonzero digits with equivalent strings having only nonconsecutive nonzero digits. Hereinafter, $-1$ will be represented as n for convenience of description. Then, 01111 in two's complement is represented as 1000n in CSD. A binary number in two's complement may be easily converted to a number in CSD as described above, and all binary numbers in two's complement may be represented as numbers in CSD.

In contrast to a number in two's complement, the most number of nonzero digits in an N-digit CSD number is $(N+1)/2$, and this implies that the number of adders (or subtractors) may be reduced in multiplication implementations using CSD numbers. Multiplication of the filter coefficients may be implemented using addition and shift operations, which are easily implemented using hardwired logic. That said, studies and research efforts have focused on reduction of the number of additions by using CSD numbers.

However, when CSD is used for linear-phase filter coefficients, additional memory may be needed (e.g., to store the sign of each digit) so that the size of hardware and manufacturing expense may not be minimized.

The above information disclosed in this Background section is only for enhancement of understanding of the background of the invention and therefore it may contain information that does not form the prior art that is already known in this country to a person of ordinary skill in the art.

SUMMARY

Embodiments of the present invention provide for a common sub-expression elimination method. Further embodiments provide for a method for simplifying a filter logic circuit by iteratively searching for common sub-expressions in a FIR filter circuit and eliminating any found common sub-expressions.

According to an embodiment of the present invention, a common sub-expression elimination method for simplifying hardware logic of a hardware filter circuit by eliminating a common sub-expression included in a plurality of sub-expressions is provided. Each of the sub-expressions includes a corresponding two or more of inputs constituting a plurality of coefficients used by the hardware filter circuit. The method includes: identifying, on a computing device, for each coefficient of the plurality of coefficients, a combination of the inputs constituting the coefficient; counting, on the computing device, occurrences of the sub-expressions in each of the coefficients; identifying, by the computing device, one or more of the sub-expressions having a maximum one of the counts and including the corresponding two or more of the inputs; selecting, by the computing device, one of the one or more of the sub-expressions as the common sub-expression; eliminating, by the computing device, the common sub-expression; and repeating the counting of the occurrences of the sub-expressions, the identifying of the one or more of the sub-expressions having the maximum one of the counts, the selecting of the common sub-expression, and the eliminating of the common sub-expression to eliminate more of the sub-expressions common to multiple ones of the coefficients.

The repeating of the counting of the occurrences of the sub-expressions, the identifying of the one or more of the sub-expressions having the maximum one of the counts, the selecting of the common sub-expression, and the eliminating of the common sub-expression may continue until the maximum one of the counts equals one.

When the one or more of the sub-expressions includes two or more of the sub-expressions, the selecting of the common sub-expression may further includes: determining, by the computing device, for each input of the corresponding two or more of the inputs of each sub-expression of the two or more of the sub-expressions, a largest one of the counts of the sub-expressions including the input but excluding the sub-expression; identifying, by the computing device, one or more of the inputs having a minimum one of the largest ones of the counts; and selecting, by the computing device, the sub-expression corresponding to one of the one or more of the inputs as the common sub-expression.

The corresponding two or more of the inputs may include exactly two of the inputs.

The eliminating of the common sub-expression may include: adding, by the computing device, the common sub-expression as a new input to the inputs; and replacing, by the computing device, the corresponding two or more of the inputs from the inputs constituting each of the coefficients sharing the common sub-expression with the new input.

The hardware filter circuit may include a linear-phase filter and the coefficients may include linear-phase filter coefficients.

The hardware filter circuit may include a finite impulse response (FIR) filter.

The sub-expressions may include sums of the corresponding two or more of the inputs.

The inputs may include different powers of two.

The inputs may further include sums of the powers of two corresponding to the eliminated sub-expressions common to multiple ones of the coefficients.

In example common sub-expression elimination methods according to embodiments of the present invention, the size of a circuit and manufacturing expense may be minimized with a simple circuit structure. In addition, a low-power/high-speed filter may be designed.

BRIEF DESCRIPTION OF THE DRAWINGS

FIG. 2 is a table of example filter coefficients according to an embodiment of the present invention.

FIG. 3 shows an input/output matrix A(i,j) of two's complement numbers generated from example filter coefficients according to an embodiment of the present invention.

FIG. 4 shows a matrix B(i,j) obtained by applying the following equation to the matrix A(i,j) in FIG. 3.

$$B(i, j) = \begin{cases} \sum_{k=1}^{m} A(k, i) * A(k, j), \text{ for}(i \neq j), \\ B(i, j) = 0, \text{ for}(i = j), \end{cases}$$

$$(i = 1, 2 \ldots n, j = 1, 2 \ldots n)$$

FIG. 5 shows a matrix B(i,j) obtained by applying the equation of FIG. 4 to a matrix of example filter coefficients according to another embodiment of the present invention.

FIG. 6 shows the matrix A(i, j) of FIG. 3 that is updated by eliminating a selected common sub-expression according to an embodiment of the present invention.

FIG. 7 shows the matrix A'(i, j) of FIG. 6 to which a new column is inserted representing the eliminated common sub-expression according to an embodiment of the present invention.

FIG. 8 is a matrix B'(i, j) that is newly obtained by applying the equation applied in FIG. 4 to the matrix A"(i,j) of FIG. 7 according to an embodiment of the present invention.

Figure 9:
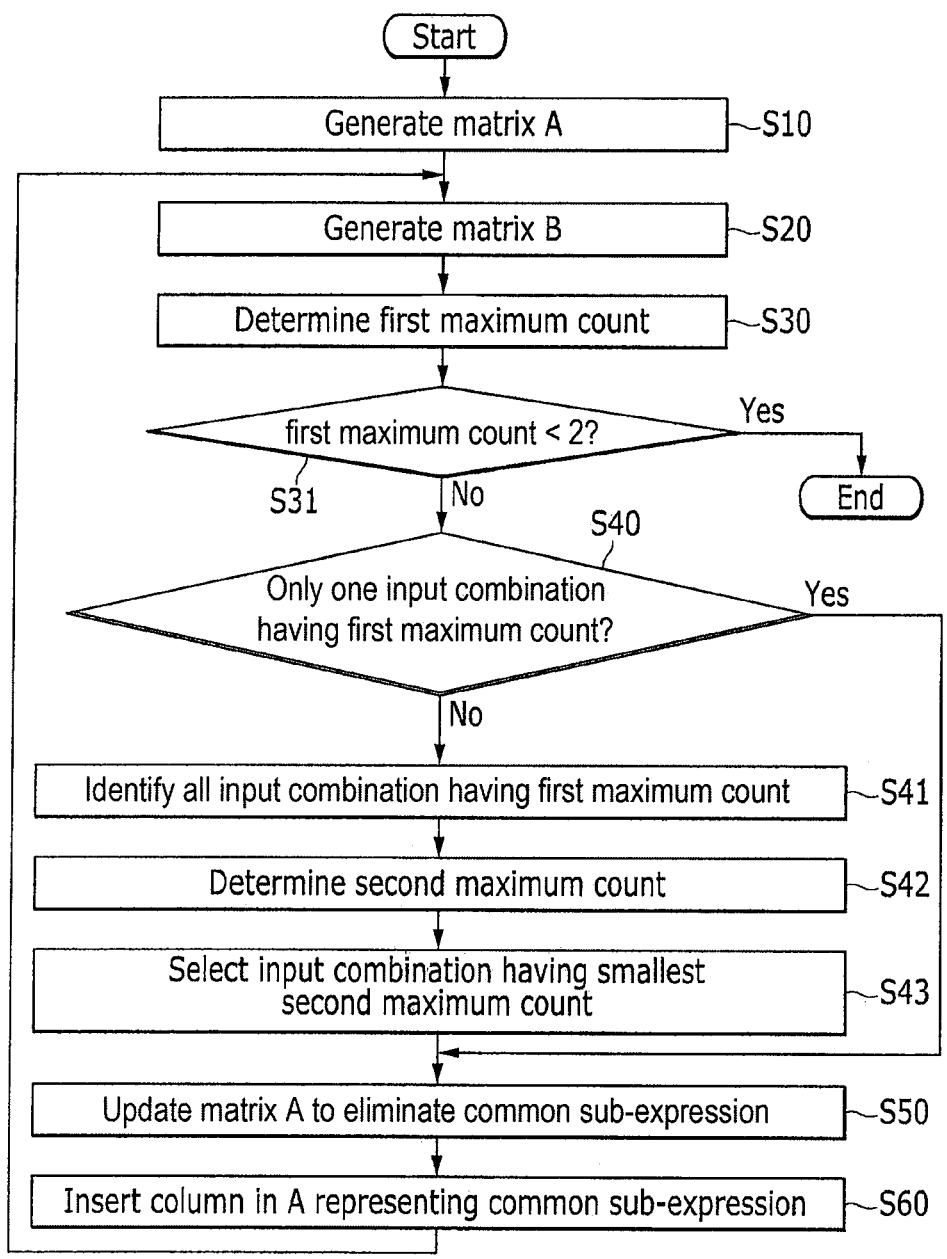

FIG. 9 is a flowchart illustrating a common sub-expression elimination method according to an embodiment of the present invention.

DETAILED DESCRIPTION

Hereinafter, example embodiments of the present invention will be described in detail with reference to the accompanying drawings, like reference numerals designate like elements throughout the specification, and the drawings and description are to be regarded as illustrative in nature and not restrictive. Words such as "module" and "unit" are mainly intended to facilitate description of the described embodiments, and the words themselves are not necessarily intended to give any special meaning.

In addition, in describing aspects of the present invention, when the specific description of related technology departs from the scope of the present invention, the detailed description of the corresponding related technology may be omitted. Further, the accompanying drawings are used to help ease of understanding of various technical features, and it should be understood that the embodiments presented herein are not limited by the accompanying drawings. While the present invention may be embodied in many different forms, specific embodiments of the present invention are shown in drawings and are described herein in detail, with the understanding that the present invention is not intended to be limited to the specific embodiments illustrated.

A term such as "first" or "second" may be used to describe various elements, but the elements are not limited by the terms. The terms are used mainly for distinguishing one element from another element.

It is to be understood that when any component is referred to as being connected to or coupled to another component, it may be directly connected to or directly coupled to the other component or be connected to or coupled to the other component with one or more further components intervening therebetween. On the other hand, it is to be understood that when one component is referred to as being directly connected to or directly coupled to another component, it is connected to or coupled to the other component without a further component intervening therebetween.

Singular forms used herein are intended to include plural forms unless explicitly indicated otherwise. It will be understood that the term "comprises" or "have" used in this specification specifies the presence of stated features, numerals, steps, operations, components, parts, or a combination thereof, but does not preclude the presence or addition of one or more other features, numerals, steps, operations, components, parts, or combinations thereof.

Herein, the use of the term "may," when describing embodiments of the present invention, refers to "one or more embodiments of the present invention." In addition, the use of alternative language, such as "or," when describing embodiments of the present invention, refers to "one or more embodiments of the present invention" for each corresponding item listed.

The elimination method for common sub-expression and filter using the elimination method and/or any other relevant devices or components according to embodiments of the present invention described herein may be implemented utilizing any suitable hardware, firmware (e.g., an application-specific integrated circuit), software, or a suitable combination of software, firmware, and hardware. For example, the various components of the elimination method for common sub-expression and filter using the elimination method may be formed on one integrated circuit (IC) chip or on separate IC chips. Further, the various components of the elimination method for common sub-expression and filter using the elimination method may be implemented on a flexible printed circuit film, a tape carrier package (TCP), a printed circuit board (PCB), or formed on a same substrate as the elimination method for common sub-expression and filter using the elimination method.

Further, the various components of the elimination method for common sub-expression and filter using the elimination method may be a process or thread, running on one or more processors, in one or more computing devices, executing computer program instructions and interacting with other system components for performing the various functionalities described herein. The computer program instructions are stored in a memory that may be implemented in a computing device using a standard memory device, such as, for example, a random access memory (RAM). The computer program instructions may also be stored in other non-transitory computer readable media such as, for example, a CD-ROM, flash drive, or the like. In addition, a person of skill in the art should recognize that the functionality of various computing devices may be combined or integrated into a single computing device, or the functionality of a particular computing device may be distributed across one or more other computing devices without departing from the scope of the present invention.

Figure 1:
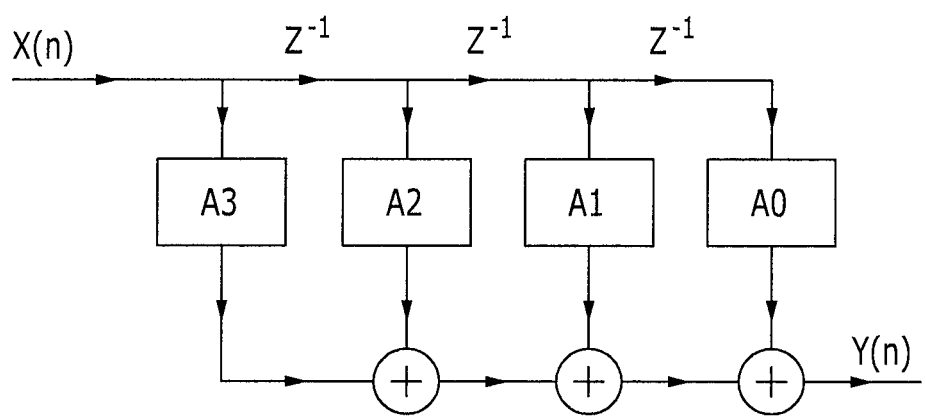
FIG. 1 is a schematic diagram of a filter used in a common sub-expression elimination method according to an embodiment of the present invention.

FIG. 1 is a schematic diagram of a filter used in a common sub-expression elimination method according to an embodiment of the present invention.

The filter is implemented by Equation 1.

$$Y(n) = \sum_{i=0}^{N-1}\sum_{j=0}^{M-1} a_{ij} 2^j X(n - (N-1) + i).$$ [Equation 1]

In Equation 1, X(i) are input signals, Y(n) is an output signal, and $$A_i = \sum_{j=0}^{M-1} a_{ij} 2^j$$

are a set of constant filter coefficients, such as integers in binary representation. N denotes the number of filter coefficients and M denotes a word length (e.g., number of bits in each filter coefficient).

Referring to FIG. 1, a FIR filter structure when the number of filter coefficients is 4 (e.g., N=4) is illustrated. The size or word length of each of the coefficients 4 to 4 is 9 bits (e.g., M=9). Among the 9 bits, one bit, for example, the least significant bit (LSB), is a sign bit of the coefficient, and the remaining 8 bits represent the magnitude of the coefficient.

When the number of filter coefficients is 4, an output signal Y(n) is generated from Equation 2 and Equation 3, three additions are used for obtaining the output signal Y(n), and the filter coefficients $A_0$ to $A_3$ that correspond to input signals X(n−3), X(n−2), X(n−1), and X(n) are respectively multiplied. The filter coefficients $A_i$ are represented as in Equation 3, where each of the $a_{ij}$ represents a bit value (e.g., 0 or 1) in the binary representation of $A_i$. The binary representation of the filter coefficients $A_0$ to $A_3$ are multiplied by the respective input signals X(n−3), X(n−2), X(n−1), and X(n).

$$Y(n) = X(n)A_3 + X(n-1)A_2 + X(n-2)A_1 + X(n-3)A_0$$ [Equation 2]

$$A_i = \sum_{j=0}^{M-1} a_{ij} 2^j$$ [Equation 3]

$$Y(n) = X(n)\sum_{j=0}^{M-1} a_{3j} 2^j + X(n-1)\sum_{j=0}^{M-1} a_{2j} 2^j +$$

$$X(n-2)\sum_{j=0}^{M-1} a_{1j} 2^j + X(n-3)\sum_{j=0}^{M-1} a_{0j} 2^j$$

Multiplication by the binary representation may be implemented by add and shift operations. Such adding and shifting in one coefficient are common in calculations involving other coefficients, and they are performed once for all coefficients rather than being separately performed for each coefficient. Such a common addition of the binary representation of the coefficient is referred to as a common sub-expression. When an addition (or adder) including two elements is used, the adder is referred to as a 2-bit common sub-expression.

In the filter of FIG. 1, four filter coefficients are provided for convenience of description, but the present invention is not limited thereto. When numerous (for example, four or more) filter coefficients are used, it may become too difficult to manually find all of the common sub-expressions. At least two elements common to two or more coefficients may form a common sub-expression. Depending on factors such as the size or number of filter coefficients, it may be effectively impossible to find all such common sub-expressions to reduce the number of adders of the filter.

Hereinafter, an algorithm for finding such a common sub-expression and eliminating the common sub-expression in different coefficients according to an embodiment of the present invention will be described. The algorithm may be implemented on a computing device to simplify a hardware filter circuit design (e.g., reducing the size, complexity, power consumption, etc.) used to build a hardware filter circuit (such as a FIR filter circuit or a linear-phase filter circuit).

FIG. 2 is a table of example filter coefficients according to an embodiment of the present invention.

FIG. 3 shows an input/output matrix A(i, j) of two's complement numbers generated from example filter coefficients according to an embodiment of the present invention.

FIG. 4 is a matrix B(i, j) obtained by applying Equation 4 to the matrix A(i, j) of FIG. 3.

$$B(i, j) = \left\{ \sum_{k=1}^{m} A(k, i) * A(k, j), \text{ for}(i \neq j), \right.$$ [Equation 4]

$$B(i, j) = 0, \text{ for}(i = j),$$

$$(i = 1, 2 \ldots n, j = 1, 2 \ldots n)$$

FIG. 5 shows a matrix B(i,j) obtained by applying Equation 4 to a matrix of example filter coefficients according to another embodiment of the present invention.

FIG. 6 shows the matrix A(i,j) of FIG. 3 that is updated by eliminating a selected common sub-expression according to an embodiment of the present invention.

FIG. 7 shows the matrix A'(i, j) of FIG. 6 to which a new column is inserted representing the eliminated common sub-expression according to an embodiment of the present invention.

FIG. 8 is a matrix B'(i, j) that is newly obtained by applying Equation 4 to the matrix of FIG. 7 according to an embodiment of the present invention.

FIG. 9 is a flowchart illustrating a common sub-expression elimination method according to an embodiment of the present invention.

Hereinafter, a common sub-expression elimination method according to an embodiment of the present invention will be described with reference to FIG. 2 to FIG. 9.

For convenience of description, 26$^{th}$ order filters will be described, but the present invention is not limited thereto. In addition, the high precision filter coefficients a0 to a12 of FIG. 2 are random coefficients, but the present invention is not limited thereto.

Referring to the method of FIG. 9, in step S10, the filter coefficient matrix A of FIG. 3 is generated (for example, using more precise filter coefficients, such as the high precision filter coefficients a0 to a25 of FIG. 2). The columns of the filter coefficient matrix A represent the different bits of the filter coefficients in their binary representations, and are henceforth referred to as inputs of the coefficient matrix A, while the rows of the filter coefficient matrix A represent the different filter coefficients A0 to A25, and are henceforth referred to as outputs. Thus, initially, each of the filter coefficients A0 to A25 may be a combination of up to eight different powers of two that vary, for example, from $1=2^0$ to $128=2^7$ (e.g., input i corresponds to $2^{i-1}$), but this is not intended to be restrictive.

Referring to FIG. 3, each column of the matrix A represents a different bit of the filter coefficients, the matrix A having a number of columns that is equivalent to the number of bits of each of the coefficients, and a number of rows equivalent to the number of coefficients. For example, A may be an m×n matrix of filter coefficients, where n is the number of bits of each of the coefficients and m is the number of coefficients. For example, the matrix A may represent information on the binary representation of the magnitude of the coefficient that varies from 0 to $255=2^8-1$ (e.g., n=8). In further detail, each of the columns of matrix A may correspond to a different shift amount for products involving corresponding coefficients whose column bit is set. As will be seen, additional inputs (columns) may be added to matrix A as part of the common sub-expression elimination method.

In step S20, a diagonal symmetric matrix B is generated using the matrix A. The matrix B of FIG. 4 is generated using Equation 4 above.

Here, m denotes the number of outputs (coefficients) and n denotes the number of inputs (which starts as the number of bits in each coefficient and grows with each common sub-expression eliminated). The matrix B(i,j) with respect to k that varies from 1 to m represents the number of occurrences when the i-th and j-th elements of the matrix A are both 1. The matrix B represents the number of common sub-expressions (number of outputs) formed by the same respective two elements of the inputs, where the larger the value of B(i,j), the more outputs (coefficients) share the common sub-expression between inputs i and j. Referring to the matrix A, the element B(i,j) of the matrix B with respect to k that varies from 1 to m (e.g., m=1 to 26 in the matrix A of FIG. 3) represents the number of occurrences when the bits of the i-th and j-th columns (inputs) are both 1. The matrix B includes initial information with respect to whether the common sub-expression is generated from a combination of any two bits in i-th and j-th columns.

For ease of description, matrix dimensions may be described as being indexed from 1 (e.g., 1 to 26) or from 0 (e.g., 0 to 25), sometimes interchangeably, with the meaning apparent from context to one of ordinary skill. In addition, matrix B is depicted as being n×n, but since B is a symmetric matrix with main diagonal=0, matrix B may be calculated using a significantly smaller number of operations or stored in significantly fewer storage locations than ordinary square matrices. In addition, for ease of description, when referring to matrix B, it will usually be assumed that the only entries being considered are those above the main diagonal of B (i.e., the entries B(i,j) where i<j), and not including those of the main diagonal (i=j) or below the main diagonal (i>j), unless it is apparent from context that all entries of matrix B are being considered.

In step S30, the maximum integer (or maximum count, or first maximum count) and a location of the (first) maximum count in the matrix B are determined. For example, in the matrix B of FIG. 4, the maximum count (10) occurs at B(2,3). The value 10 at location (2,3) of matrix B in FIG. 4 represents the most number of outputs (coefficients) where the inputs (e.g., bit positions 2 and 3) are both 1 in matrix A of FIG. 3. As will be described later, this common sub-expression (e.g., bits 2 and 3 in the inputs) represents the most common sub-expression in matrix A, and may be consolidated (eliminated) from the existing inputs and replaced with a new (input) column, and this process repeated with the next most common sub-expression until all of the common sub-expressions are eliminated.

While matrix B in FIG. 4 has only one such maximum count, this is not necessarily always the case. Accordingly, FIG. 5 depicts another example matrix B (e.g., generated from a different input/output matrix than the matrix B in FIG. 4), this time with numerous occurrences (four) of the maximum count (10).

Referring to FIG. 4 and FIG. 5, the maximum count represents a location (and the value) of the largest integer in the matrix B. The corresponding bit i and bit j (or inputs i and j) are two bits that may form a common sub-expression (when both are 1) according to magnitudes of the coefficients of the matrix A (used to generate B) corresponding to the i-th and j-th columns of A. If the maximum integer exists in an i-th row and a j-th column (or a j-th row and an i-th column) of the matrix B, this implies that the number of times where both bits are 1 in the same coefficient is the most in the (i,j) bit combination (or input combination) compared to the other two input combinations.

When the maximum integer is searched for in the matrix B, locations of two bits of "n" (corresponding to two columns or inputs) of matrix A that include the most number of coefficients or outputs having both bits set with respect to other combinations of two bits of "n" may be determined. If "i" and "j" are those two columns, the largest (or most) common sub-expression may be formed by combining inputs "i" and "j" of "n." As shown later, a new column (input) may be added to matrix A consolidating (eliminating) the 2-bit common sub-expression in those outputs (coefficients) corresponding to the i-th and j-th inputs. Referring to matrix B in FIG. 4 and FIG. 5, the maximum integer is "10."

During consolidation or elimination, two bits may be combined to form a pair, and accordingly, only one bit (input) in matrix A needs to be used to represent the common sub-expression. This input may be a new column of matrix A, and may be set for each output (coefficient) having a 1 bit in both the i-th and j-th inputs, while the corresponding 1-bits in the i-th and j-th inputs are reset for these outputs. The process may then be continued with the new matrix A until all of the common sub-expressions are identified and consolidated (eliminated), leaving no value in the matrix B larger than one (that is, no more common sub-expressions).

In step S31, it is determined whether the maximum integer (count) in matrix B is smaller than 2, and if the maximum count is less than 2, processing ends and all common sub-expressions have been identified and eliminated.

In step S40, the maximum count is greater than or equal to 2 in the matrix B, so it is determined whether the number of integers of the matrix B having this maximum count is 1 (again, not counting symmetric duplicates). In other words, is there only one combination of indices i and j (i<j) such that B(i,j) equals the maximum count in B? When the number of pairs of indices corresponding to the maximum count of the matrix B is 1, the common sub-expression corresponding to this set of indices is selected, the common sub-expression is eliminated, and the matrix A is updated.

Referring to FIG. 5, there are four input combinations (i,j) (where i<j) for B(i,j) taking on the maximum value (10), namely (1,4), (1,6), (2,3), and (3,4). Accordingly, further processing is done to determine which of these four input combinations is selected for common sub-expression elimination.

In step S41, the full matrix B (including entries above and below the main diagonal) is considered, together with all eight input combinations (four of which are symmetric duplicates of the other four) having a maximum count of 10, namely (1,4), (1,6), (2,3), (3,2), (3,4), (4,1), (4,3), and (6,1). To each of these eight input combinations, which have a maximum count (or first maximum count) of 10, a second maximum count is determined. While steps S20 to S40 help identify the most common sub-expression in matrix A, when there are more than one such common sub-expressions, steps 41 and later help identify which of these common sub-expressions is the best choice for common sub-expression elimination, namely the common sub-expression whose elimination is the least impacting on the other common sub-expressions (as measured by the second maximum counts).

In step S42, the second maximum counts are determined for each of the multiple input combinations identified in step S41. For each such input combination (i,j) having the same first maximum count (e.g., 10 in FIG. 5), the second maximum count is set to the largest count in the j-th row of matrix B other than the symmetric entry (j,i) (which shares the same first maximum count as entry (i,j)). For example, in FIG. 5, for the input combination (1,4), the 4th row of matrix B, excluding the first entry (4,1), is examined and the largest count extracted, namely 10 (corresponding to the third entry (4,3)), which becomes the second maximum count for (1,4). Doing likewise for the other input combinations having a first maximum count of 10, namely (1,6), (2,3), (3,2), (3,4), (4,1), (4,3), and (6,1), produces respective second maximum counts of 8, 10, 8, 10, 10, 10, and 10.

In step S43, the second maximum counts are compared, the minimum second maximum count is selected, and the corresponding input combination used for common sub-expression elimination. For example, in FIG. 5, the smallest second maximum count is 8, corresponding to the input combinations (1,6) and (3,2). At this point, either input combination may be selected for common sub-expression elimination since they share the same first maximum count (10) and the same minimum second maximum count (8). For example, input combination (1,6) (corresponding to the first and sixth inputs of matrix A) may be selected for common sub-expression elimination. In other embodiments, still further criteria may be used to decide between such input combinations sharing the same first and second maximum counts (such as adding all of the counts in the j-th row for input combination (i,j) and selecting the input combination having the minimum such sum).

In step S50, referring now to FIG. 3, FIG. 4, and FIG. 6, when the common sub-expression corresponding to input combination (i,j) (e.g., combination (2,3) in the embodiment of FIG. 4) is selected, the matrix A (e.g., of FIG. 3) becomes an updated matrix A' (e.g., of FIG. 6) with respect to the corresponding inputs (columns) i and j. For each output (coefficient) where both inputs i and j (e.g., columns 2 and 3 in FIG. 3) are set in matrix A, they are reset in matrix A'.

In step S60, an input column (such as input n+1) corresponding to the new common sub-expression (inputs i and j, such as $2^{i-1}+2^{j-1}$) is added to matrix A' and the entries are generated to produce a matrix A"(e.g., as in FIG. 7). In further detail, for each output (coefficient) where both inputs i and j (e.g., columns 2 and 3 in FIG. 3) are set in matrix A (and then reset in matrix A'), the corresponding entry in the new input column (e.g., input n−1, such as input 9 in FIG. 7) in matrix A" is set.

When a new input column is added, the common sub-expression elimination method is restarted from step S20. Thus, common sub-expressions are iteratively searched and eliminated until all possible common sub-expressions are generated using the common sub-expression elimination method. For example, a common sub-expression recognized by bit 1 and bit 6 may be represented as $2^0+2^5$. The process is returned to step S20 to search for the next most common sub-expression until the maximum count among elements of the matrix B is no longer greater than 1. For example, a newly generated matrix B' based on the matrix A" of FIG. 7 is shown in FIG. 8.

The common sub-expression elimination method may be terminated when the maximum count in the matrix B is smaller than 2. As such, when the common sub-expression elimination method terminates, the inputs of matrix A may represent all common sub-expressions that may be generated. Such a common sub-expression elimination method may be used, for example, in calculation of coefficients (A0 to A3) of the FIR filter of FIG. 1. In other embodiments, the sub-expression elimination may terminate sooner, such as after generating a set or predetermined number of common sub-expressions, or after reaching a maximum count in the matrix B that is smaller than a set or predetermined minimum number larger than 2.

While the present invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims, and equivalents thereof. Therefore, it should be considered that the above description is not limitative, but illustrative in all aspects. The scope of the present invention is defined by the appended claims, and therefore all changes and modifications that fall within metes and bounds of the claims, or equivalents of such metes and bounds, are intended to be embraced by the claims.

What is claimed is:

1. A common sub-expression elimination method for simplifying hardware logic of a hardware filter circuit by eliminating a common sub-expression included in a plurality of sub-expressions, each of the sub-expressions comprising a corresponding two or more of inputs constituting a plurality of coefficients used by the hardware filter circuit, the method comprising:
   identifying, on a computing device, for each coefficient of the plurality of coefficients, a combination of the inputs constituting the coefficient;
   counting, on the computing device, occurrences of the sub-expressions in each of the coefficients;
   identifying, by the computing device, one or more of the sub-expressions having a maximum one of the counts and comprising the corresponding two or more of the inputs;
   selecting, by the computing device, one of the one or more of the sub-expressions as the common sub-expression;
   eliminating, by the computing device, the common sub-expression; and
   repeating the counting of the occurrences of the sub-expressions, the identifying of the one or more of the sub-expressions having the maximum one of the counts, the selecting of the common sub-expression, and the eliminating of the common sub-expression to eliminate more of the sub-expressions common to multiple ones of the coefficients, wherein, when the one or more of the sub-expressions comprises two or more of the sub-expressions, the selecting of the common sub-expression further comprises:

determining, by the computing device, for each input of the corresponding two or more of the inputs of each sub-expression of the two or more of the sub-expressions, a largest one of the counts of the sub-expressions comprising the input but excluding the sub-expression;

identifying, by the computing device, one or more of the inputs having a minimum one of the largest ones of the counts; and selecting, by the computing device, the sub-expression corresponding to one of the one or more of the inputs as the common sub-expression.

2. The common sub-expression elimination method of claim 1, wherein the repeating of the counting of the occurrences of the sub-expressions, the identifying of the one or more of the sub-expressions having the maximum one of the counts, the selecting of the common sub-expression, and the eliminating of the common sub-expression continues until the maximum one of the counts equals one.

3. The common sub-expression elimination method of claim 1, wherein the corresponding two or more of the inputs comprises exactly two of the inputs.

4. The common sub-expression elimination method of claim 1, wherein the eliminating of the common sub-expression comprises:

adding, by the computing device, the common sub-expression as a new input to the inputs; and replacing, by the computing device, the corresponding two or more of the inputs from the inputs constituting each of the coefficients sharing the common sub-expression with the new input.

5. The common sub-expression elimination method of claim 1, wherein the hardware filter circuit comprises a linear-phase filter and the coefficients comprise linear-phase filter coefficients.

6. The common sub-expression elimination method of claim 1, wherein the hardware filter circuit comprises a finite impulse response (FIR) filter.

7. The common sub-expression elimination method of claim 1, wherein the sub-expressions comprise sums of the corresponding two or more of the inputs.

8. The common sub-expression elimination method of claim 1, wherein the inputs comprise different powers of two.

9. The common sub-expression elimination method of claim 8, wherein the inputs further comprise sums of the powers of two corresponding to the eliminated sub-expressions common to multiple ones of the coefficients.

10. A common sub-expression elimination method for simplifying hardware logic of a hardware filter circuit by eliminating a common sub-expression included in a plurality of sub-expressions, each of the sub-expressions comprising a corresponding two or more of inputs constituting a plurality of coefficients used by the hardware filter circuit, the method comprising:

identifying, on a computing device, for each coefficient of the plurality of coefficients, a combination of the inputs constituting the coefficient;

counting, on the computing device, occurrences of the sub-expressions in each of the coefficients;

identifying, by the computing device, one or more of the sub-expressions having a maximum one of the counts and comprising the corresponding two or more of the inputs;

selecting, by the computing device, one of the one or more of the sub-expressions as the common sub-expression;

eliminating, by the computing device, the common sub-expression; and repeating the counting of the occurrences of the sub-expressions, the identifying of the one or more of the sub-expressions having the maximum one of the counts, the selecting of the common sub-expression, and the eliminating of the common sub-expression to eliminate more of the sub-expressions common to multiple ones of the coefficients, wherein the eliminating of the common sub-expression comprises:

adding, by the computing device, the common sub-expression as a new input to the inputs; and replacing, by the computing device, the corresponding two or more of the inputs from the inputs constituting each of the coefficients sharing the common sub-expression with the new input.

11. The common sub-expression elimination method of claim 10, wherein the repeating of the counting of the occurrences of the sub-expressions, the identifying of the one or more of the sub-expressions having the maximum one of the counts, the selecting of the common sub-expression, and the eliminating of the common sub-expression continues until the maximum one of the counts equals one.

12. The common sub-expression elimination method of claim 10, wherein the corresponding two or more of the inputs comprises exactly two of the inputs.

13. The common sub-expression elimination method of claim 10, wherein the hardware filter circuit comprises a linear-phase filter and the coefficients comprise linear-phase filter coefficients.

14. The common sub-expression elimination method of claim 10, wherein the hardware filter circuit comprises a finite impulse response (FIR) filter.

15. The common sub-expression elimination method of claim 10, wherein the sub-expressions comprise sums of the corresponding two or more of the inputs.

16. The common sub-expression elimination method of claim 10, wherein the inputs comprise different powers of two.

17. The common sub-expression elimination method of claim 16, wherein the inputs further comprise sums of the powers of two corresponding to the eliminated sub-expressions common to multiple ones of the coefficients.

* * * * *